(12) United States Patent
Guo

(10) Patent No.: US 6,297,105 B1
(45) Date of Patent: Oct. 2, 2001

(54) METHOD OF FORMING ASYMMETRIC SOURCE/DRAIN FOR A DRAM CELL

(75) Inventor: Jyh-Chyum Guo, Hsinchu Hsien (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/595,265

(22) Filed: Jun. 15, 2000

(30) Foreign Application Priority Data

Mar. 24, 2000 (TW) .............................................. 89105429 A

(51) Int. Cl.[7] .................................................. H01L 21/336
(52) U.S. Cl. .......................... 438/286; 438/279; 438/299; 438/303
(58) Field of Search ..................................... 438/286, 239, 438/240, 247, 250, 251, 253, 254, 255, 256, 275, 279, 383, 393, 394, 395, 396, 299, 303

(56) References Cited

U.S. PATENT DOCUMENTS

| 4,851,360 | * | 7/1989 | Haken et al. | 437/29 |
| 4,935,379 | * | 6/1990 | Toyoshima | 437/44 |
| 5,926,707 | * | 7/1999 | Seo | 438/238 |
| 6,162,669 | * | 12/2000 | Horita et al. | 438/231 |

* cited by examiner

*Primary Examiner*—Charles Bowers
*Assistant Examiner*—Jack Chen
(74) *Attorney, Agent, or Firm*—Darby & Darby

(57) ABSTRACT

A method of forming asymmetric source/drain for a DRAM cell, whereas a graded junction is formed at a node contact terminal and an abrupt junction being formed at a bit line contact terminal, so as to reduce the short channel effect in the bit line contact region and junction leakage current at the contact node, both of a DRAM cell, so that the charge retention time is augmented.

6 Claims, 4 Drawing Sheets

METHOD OF FORMING ASYMMETRIC SOURCE/DRAIN FOR A DRAM CELL

BACKGROUND OF THE INVENTION

1. Field of the Invention

The present invention relates to a method of forming asymmetric source/drain for a DRAM cell and more particularly to a method of forming transistors with reduced short channel effect (SCE) and junction leakage current so as to improve the reliability of a DRAM device.

2. Description of the Prior Art

As the function of a microprocessor is becoming more and more powerful and the operation scale of computer programs software is becoming larger and larger, the demand for increasing the memory capacity of a memory storage device increases substantially. Strong demand for high capacity memory storage have provided a driving force pushing the semiconductor manufacturing technology to a higher level of integration, which aims at fabricating low-cost memory devices with high memory capacity. Attributed to 1T1C (1-Transistor, 1-Capacitor) structure adopted by DRAM cell higher integration level in comparison with other types of memory devices can be realized. The size of a transistor in a DRAM cell is therefore shrunk in order to increase the level of integration in a DRAM device. However, as the size is reduced to a sub-micron level, short channel effect (SCE) and junction leakage current become very serious problems.

When the problem of a junction leakage current occurs, the charges stored in the capacitor of a DRAM can leak, which then leads to an aggravated decaying of the sensing signal during each refresh cycle. Although by raising the frequency of the refresh cycle the above-mentioned problem can be resolved; however, the operation of raising the frequency of the refresh cycle by itself can seriously and adversely affect the performance of the entire system.

Conventionally, one of the methods used to solve above-mentioned problems is the method of forming symmetrically graded junctions in the substrate on opposite sides of the gate electrode to suppress the junction leakage, which subsequently improves the cell charge retention. However, this method tends to exacerbate the short channel effect. Another method forms symmetric abrupt junctions in the substrate on opposite sides of the gate electrode to suppress the short channel effect. However, this second method tends to dramatically worsen the junction leakage problem, especially the gate-induced-drain-leakage (GIDL), which subsequently exacerbate the leakage of the stored charges.

SUMMARY OF THE INVENTION

The object of the present invention is to provide a fabrication method of forming asymmetric sources/drains for a DRAM cell to alleviate the problems of short channel effect and junction leakage current, which subsequently can improve a DRAM cell's charge retention.

Moreover, the present invention provides a method of forming asymmetric sources/drains for a DRAM cell in order to reduce the size of the DRAM cell for increasing the integration level and bit capacity of the DRAM cell without affecting the charge storage ability and refresh frequency.

To achieve the above-mentioned objects, the method of forming asymmetric source/drain for a DRAM cell according to the present invention comprises the steps of forming a graded junction on one side of a gate structure in a substrate to be used as a node contact region and forming an abrupt junction on the other side of the gate structure in the substrate to be used as a bit line contact region.

According to an embodiment of the present invention, the method for forming the graded junction involves the implantation of $P^{31}$ ions, whereas the method for forming the abrupt junction involves the implantation of $P^{31}$ ions or $As^{75}$ ions, or both. Furthermore, the method for forming the graded junction comprises the steps of forming a spacer on both sides of the gate structure after a doped region is formed on one side of the gate structure in the substrate, followed by the forming of a SAC doped region below the doped region.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENT

Accordingly, it is important to resolve the aforementioned problem of junction leakage current in the doped region, which is connected to a node contact, due to the fact that the charge retention time representing the reliability of data storage is governed by cell leakage. On the other hand, it is as important to resolve the problem of short channel effect in the doped region, which is connected to a bit line contact, since the transistor in each DRAM cell is used as a switch to control read and write. Accordingly, the present invention provides a method of forming a transistor with asymmetric sources/drains, that is, forming a transistor with a graded junction at a node contact terminal and an abrupt junction at a bit line contact terminal so as to alleviate the short channel effect and junction leakage current problem at the same time.

FIGS. 1A to 1D show cross-sectional views of a transistor with asymmetric source/drain for a DRAM cell representing different fabricating stages according to an embodiment of the present invention.

Figure 1A:
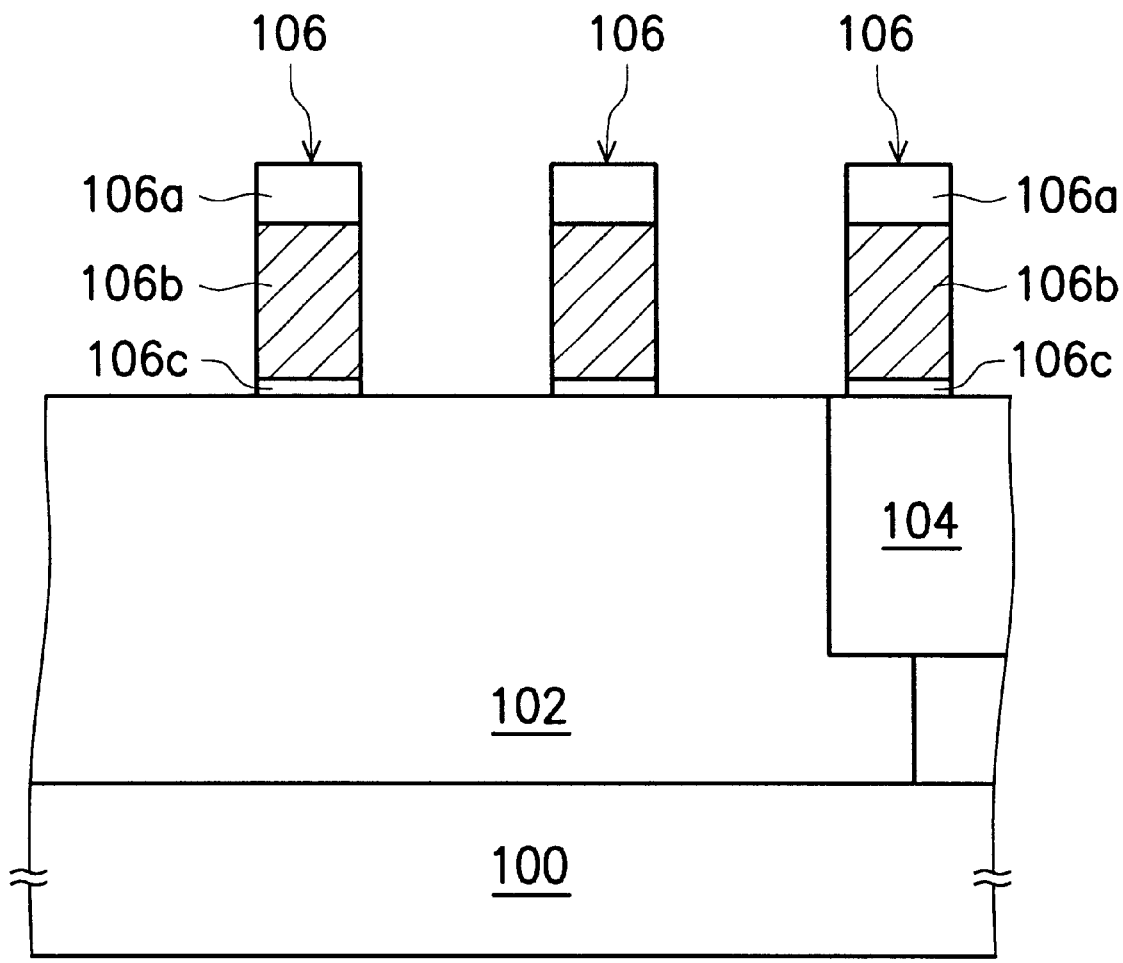
FIG. 1A through FIG. 1D show cross-sectional views of a DRAM cell with asymmetric source/drain at different fabricating stages according to an embodiment of the present invention.

Referring to FIG. 1A, a substrate 100, such as a silicon semiconductor substrate, is provided. A P-type well 102 is formed therein by proceeding an ion-implanting process with a dopant, such as $B^{11}$, wherein the foremost step of the process is to form a mask layer (not shown) on the substrate 100 as an ion implant mask layer. An isolating structure 104, such as a shallow trench structure, is formed to define an active region. A gate structure 106, such as that formed by stacked layers of a cap layer 106a, a gate conducting layer 106b and a gate oxide layer 106c, is disposed on the substrate 100.

Figure 1B:
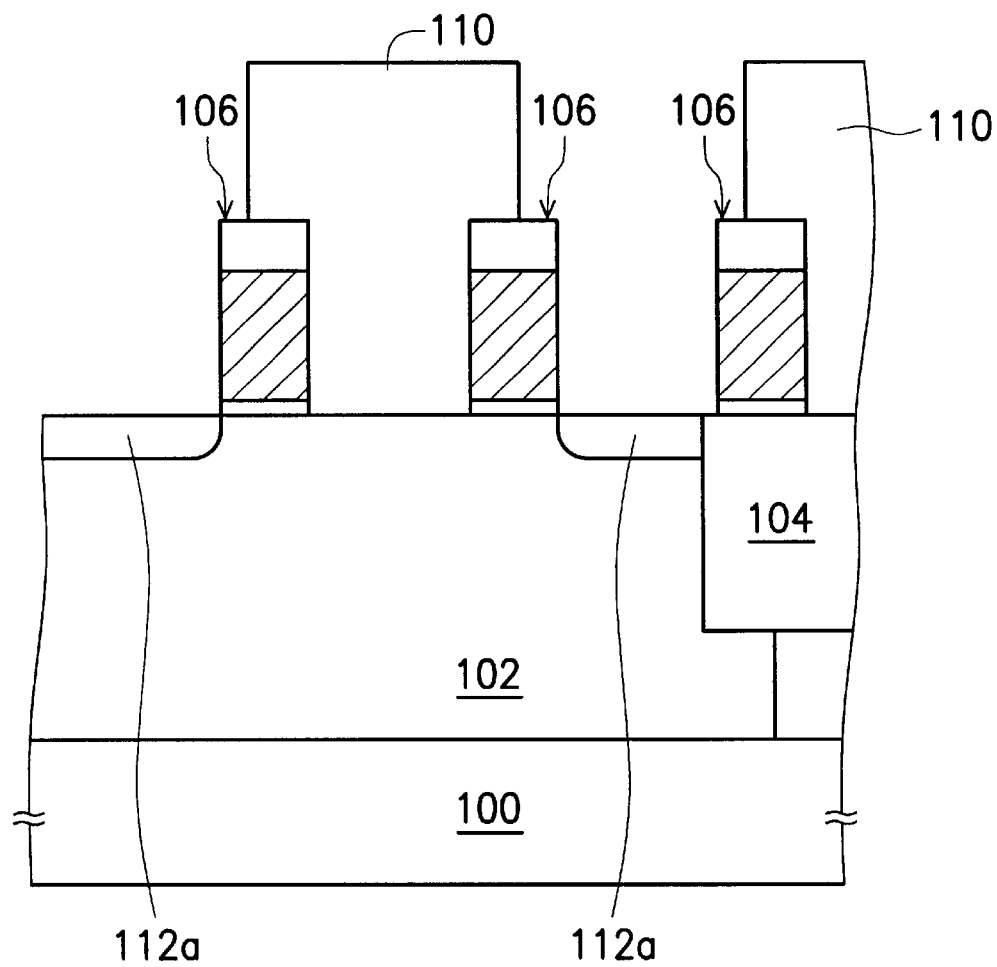

Referring to FIG. 1B, a mask layer 110, such as that formed by a layer of photoresist that exposes only the pre-determined node contact region, is disposed over the gate structure 106. The mask layer used in the photolithography process to form the mask layer 110 is the same as that used to form the node contact. Therefore, extra new mask is prevented to maintain low cost. Specifically, an N type dopant, such as a $P^{31}$ impurity with an energy of about 20 to 30 keV and a dosage of around $1\times10^{13}$ to $3\times10^{13}$ cm$^{-2}$, is implanted in the substrate 100 in order to form a doped region 112a corresponding to the pre-determined node contact region.

After the above-mentioned ion-implanting process is completed, a rapid thermal annealing is intentionally removed so as to reduce the GIDL and junction leakage current, which can improve the capacitor's charge retention time.

Figure 1C:
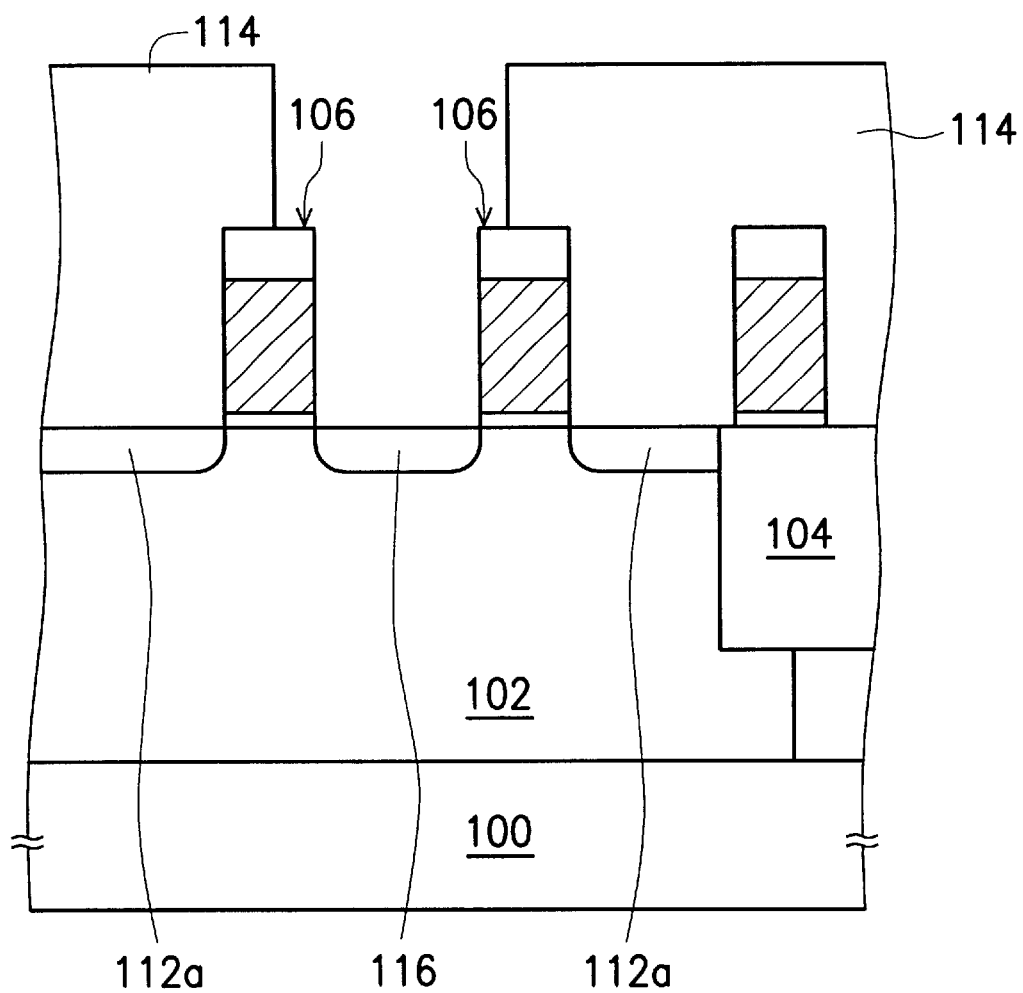

Referring to FIG. 1C, after removing the mask layer 110, another mask layer 114, such as a layer of photoresist exposing only the pre-determined bit line contact region is formed over the gate structure 106. The mask used in the photolithography process to form the mask layer 114 is the same as that used to form the bit line contact. Therefore, extra new mask is saved to maintain low cost process. Particularly, an ion-implanting process can implant such N type dopants as $P^{31}$ or $As^{75}$ or their combination to form a doped region corresponding to the pre-determined bit line contact region. If $P^{31}$ only is used as the dopant for the process, it is implanted with an energy of about 10 to 20 keV and a dosage of around $2 \times 10^{13}$ to $3 \times 10^{13}$ $cm^{-2}$. If $As^{75}$ only is used as the dopant for the process, it is implanted with an energy of about 20 to 30 keV and a dosage of around $2 \times 10^{13}$ to $3 \times 10^{13}$ $cm^{-2}$. The LDD engineering formed with combination of $P^{31}$ and $As^{75}$ implants is suggested as the best choice. The implantation conditions are specified for $P^{31}$ with an energy of about 10 to 30 keV and a dosage of around $1 \times 10^{13}$ to $3 \times 10^{13}$ $cm^{-2}$, while for $As^{75}$ energy of about 20 to 30 keV and a dosage of around $1 \times 10^{13}$ to $2 \times 10^{13}$ $cm^{-2}$ is commended.

After the above-mentioned ionimplanting process is completed, a high temperature rapid thermal process is proceeded to form a shallow abrupt junction 116 on the doped region. The high temperature rapid thermal process can be useful as a counter measure to suppress the transient-enhance-diffusion (TED) of ions while assuring effective activation of the implanted dopants. If the abrupt junction 116 is comprised of both $P^{31}$ and $As^{75}$ impurities, advantage of better short channel immunity is realized due to the fact that $As^{75}$ can help suppress the diffusion of the $P^{31}$ impurity during the rapid thermal process. The abrupt junction 116 functions as a bit line contact region, that is, a drain, which provides the benefit of smaller short channel effect and more room for further gate length scaling.

Figure 1D:
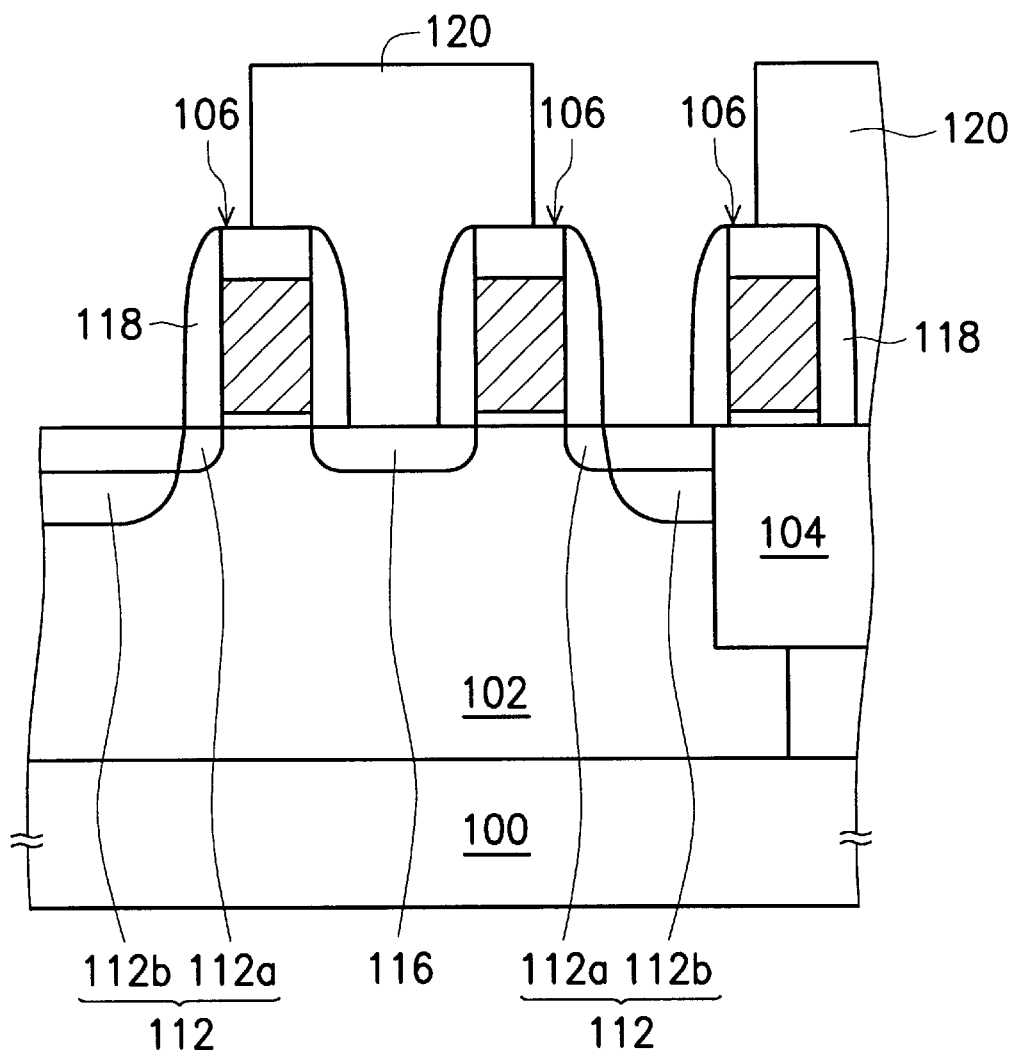

Referring to FIG. 1D, a spacer 118 is formed on opposite sides of the gate structure 106 after the mask layer 114 is removed, then another mask layer 120, such as a layer of photoresist exposing the pre-determined node contact region, is formed thereon. The mask used in the photolithography process to form the mask layer 120 is the same as that used to form the node contact. Therefore, extra new mask is saved to keep process cost as low as possible. In addition, a self-align contact (SAC) ion-implanting process implants an N type dopant, such as a $P^{31}$ dopant with an energy of about 30 to 120 keV and a dosage of around $1 \times 10^{13}$ to $3 \times 10^{13}$ $cm^{-2}$, into the substrate 100 for forming a SAC doped region 112b below the doped region 112a as shown in FIG. 1D. The doped region 112a and the SAC doped region 112b together comprise a graded junction 112 which functions as a node contact region, that is, the source. Then, the mask layer 120 is removed. At this point, performing the high temperature rapid thermal process is considered an option.

In conclusion, the present invention provides multiple advantages over the conventional methods as follows:

1. The present invention can effectively reduce the short channel effect in the bit line contact region and the junction leakage current at the node contact, so that the charge retention capability is maintained with continuously scaling DRAM cells.

2. The fabrication method according to the present invention for forming asymmetric source/drain of a DRAM cell can further miniaturize a DRAM cell so as to reach a higher level of integration and to increase thereby the capacity for more memory cells without affecting the charge storage ability and refresh rate of a DRAM device.

3. The mask used in the photolithography process to form the graded junction, which functions as the node contact region (source), is the same as the mask used to form the node contact. Therefore, extra mask is saved to keep process cost as low as possible.

4. The mask used to form the abrupt junction, which functions as the bit line contact region (drain) by photolithography is the same as the mask used to form the bit line contact. Therefore, only one mask serves multiple purposes to maintain process cost as low as possible.

The aforementioned description of the preferred embodiments of this invention have been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method of forming asymmetric source/drain for a DRAM cell, comprising the steps of:

providing a substrate having a gate structure formed thereon;

forming a first mask layer on the substrate, wherein the first mask layer exposes one side of the gate structure;

proceeding a first ion-implanting process to form a first doped region on the side of the gate structure exposed;

removing the first mask layer;

forming a second mask layer on the substrate, wherein the second mask layer exposes another side of the gate structure;

proceeding a second ion-implanting process to form a second doped region on the side of the gate structure exposed by the second mask layer to form a bit line contact region with an abrupt junction;

removing the second mask layer;

proceeding a high temperature rapid thermal process;

forming a spacer on opposite sides of the gate structure; and forming a SAC doped region below said first doped region to form a node contact region with a graded junction.

2. The method as claimed in claim 1, wherein the first ion-implanting process comprises the step of implanting an impurity $P^{31}$.

3. The method as claimed in claim 2, wherein the second ion-implanting process comprises the step of implanting impurities $P^{31}$ and $As^{75}$.

4. The method as claimed in claim 2, wherein the second ion-implant process comprises the step of implanting an impurity $P^{31}$.

5. The method as claimed in claim 2, wherein the second ion-implanting process comprises the step of implanting an impurity $As^{75}$.

6. The method as claimed in claim 1 further comprises the step of proceeding a high temperature rapid thermal process after forming said SAC doped region.

* * * * *